United States Patent
Chen et al.

(10) Patent No.: US 11,099,478 B2
(45) Date of Patent: Aug. 24, 2021

(54) PHOTOMASK HAVING RECESSED REGION

(71) Applicant: TAIWAN SEMICONDUCTOR MANUFACTURING CO., LTD., Hsinchu (TW)

(72) Inventors: Yu-Yu Chen, Taichung (TW); Chi-Hung Liao, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 184 days.

(21) Appl. No.: 16/383,595

(22) Filed: Apr. 13, 2019

(65) Prior Publication Data

US 2020/0057366 A1  Feb. 20, 2020

Related U.S. Application Data

(60) Provisional application No. 62/718,952, filed on Aug. 14, 2018.

(51) Int. Cl.

| G03F 1/76 | (2012.01) |
| H01L 21/027 | (2006.01) |
| G03F 1/00 | (2012.01) |
| H01L 21/308 | (2006.01) |
| G03F 7/20 | (2006.01) |
| G03F 7/16 | (2006.01) |
| G03F 7/30 | (2006.01) |

(52) U.S. Cl.
CPC .................. *G03F 1/76* (2013.01); *G03F 1/00* (2013.01); *G03F 7/162* (2013.01); *G03F 7/20* (2013.01); *G03F 7/30* (2013.01); *H01L 21/0274* (2013.01); *H01L 21/3086* (2013.01)

(58) Field of Classification Search
CPC ..... G03F 1/29; G03F 1/26; G03F 1/36; G03F 1/38; G03F 1/34
See application file for complete search history.

(56) References Cited

U.S. PATENT DOCUMENTS

| 5,242,770 A | * | 9/1993 | Chen ........................ G03F 1/36 430/5 |
| 5,437,947 A | * | 8/1995 | Hur .......................... G03F 1/29 430/322 |
| 7,378,196 B2 | | 5/2008 | Kim et al. |

(Continued)

FOREIGN PATENT DOCUMENTS

| CN | 103186030 A | 7/2013 |
| JP | 4741627 B2 | 8/2011 |

(Continued)

OTHER PUBLICATIONS

English Machine Translation of Shin KR-20100104117-A (Sep. 2010) (Year: 2010).*

(Continued)

*Primary Examiner* — John A McPherson
*Assistant Examiner* — Nicholas E Brown
(74) *Attorney, Agent, or Firm* — Maschoff Brennan

(57) ABSTRACT

A photomask includes a translucent substrate and at least one main feature. The translucent substrate has a recessed region recessed from a first surface of the translucent substrate. The at least one main feature is disposed on the translucent substrate, and protrudes from the first surface of the translucent substrate.

20 Claims, 18 Drawing Sheets

(56) References Cited

U.S. PATENT DOCUMENTS

| | | |
|---|---|---|
| 7,563,547 B2 | 7/2009 | Park et al. |
| 8,762,900 B2 | 6/2014 | Shin et al. |
| 8,796,666 B1 | 8/2014 | Huang et al. |
| 8,812,999 B2 | 8/2014 | Liu et al. |
| 8,850,366 B2 | 9/2014 | Liu et al. |
| 8,906,595 B2 | 12/2014 | Liu et al. |
| 8,954,899 B2 | 2/2015 | Wu et al. |
| 9,093,530 B2 | 4/2015 | Huang et al. |
| 9,367,655 B2 | 6/2016 | Shih et al. |
| 9,390,217 B2 | 7/2016 | Wang et al. |
| 9,548,303 B2 | 1/2017 | Lee et al. |
| 2001/0022216 A1* | 9/2001 | Ye .................... H01L 21/67069 156/345.1 |
| 2005/0064304 A1* | 3/2005 | Kim .................... G03F 7/70441 430/5 |
| 2005/0136341 A1* | 6/2005 | Park ........................ G03F 1/36 430/5 |
| 2008/0292975 A1 | 11/2008 | Dicker |

FOREIGN PATENT DOCUMENTS

| | | | |
|---|---|---|---|
| KR | 20100104117 A | * | 9/2010 |
| TW | 201324029 A | | 6/2013 |

OTHER PUBLICATIONS

Merriam-Webster definition of "Transparent." https://www.merriam-webster.com/dictionary/transparent. Accessed Dec. 1, 2020. (Year: 2020).*

Merriam-Webster definition of "Translucent." https://www.merriam-webster.com/dictionary/translucent. Accessed Dec. 1, 2020. (Year: 2020).*

\* cited by examiner

PHOTOMASK HAVING RECESSED REGION

PRIORITY CLAIM AND CROSS-REFERENCE

This application claims priority to U.S. Provisional Application Ser. No. 62/718,952, filed on Aug. 14, 2018, which is herein incorporated by reference in its entirety.

BACKGROUND

In integrated circuit fabrication, photomasks are used for imaging patterns onto photoresist layers during the photolithography process. The continual drive for increasing the density of transistors in integrated circuits requires increases in the density of the main features on the photomasks. As the dimensions of the main features of the photomasks become smaller and smaller, optical proximity effects distort the patterns imaged onto the photoresist layers.

BRIEF DESCRIPTION OF THE DRAWINGS

Aspects of the present disclosure are best understood from the following detailed description when read with the accompanying figures. It is noted that, in accordance with the standard practice in the industry, various main features are not drawn to scale. In fact, the dimensions of the various main features may be arbitrarily increased or reduced for clarity of discussion.

DETAILED DESCRIPTION

Figure 1:
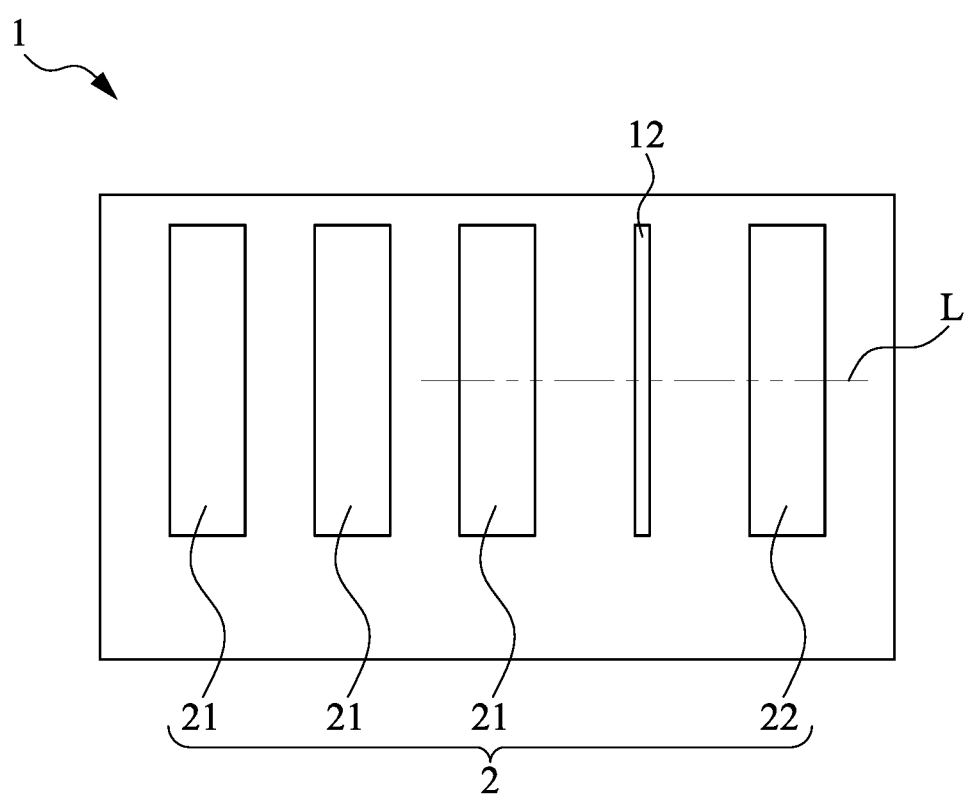
FIG. 1 shows a top view of a photomask according to some embodiments of the present disclosure.

The following disclosure provides many different embodiments, or examples, for implementing different main features of the provided subject matter. Specific examples of components and arrangements are described below to simplify the present disclosure. These are, of course, merely examples and are not intended to be limiting. For example, the formation of a first main feature over or on a second main feature in the description that follows may include embodiments in which the first and second main features are formed in direct contact, and may also include embodiments in which additional main features may be formed between the first and second main features, such that the first and second main features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or main feature's relationship to another element(s) or main feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Some embodiments of the present disclosure relates to a photomask formed with a recessed region configured to diffract radiation without imaging a pattern when illuminated from above. Some embodiments of the present disclosure also relates to a method for producing said photomask, and a method for producing integrated circuits by using said photomask.

FIG. 1 shows a top view of a photomask according to some embodiments of the present disclosure. The photomask includes a translucent substrate 1, and main features 2 disposed on the translucent substrate 1. The main features 2 are designed to image specific patterns onto a surface below (e.g. a surface of a photoresist layer) when the photomask is illuminated from above. However, due to the small dimensions of the main features 2, diffraction of radiation around the edges thereof significantly increases inaccuracies in the pattern imaged by the main feature 2. In order to create more faithful images of the main features 2, resolution enhancement technologies (RET) are used.

Each of the main features 2 has a particular process window: a range of focus and a range of exposure level at which the main feature 2, with the assistance of corresponding RETs, can be faithfully reproduced. In order to process all the main features 2 together at the same time, the process windows of the main features 2 overlap. A pitch is the distance between two elements on the translucent substrate 1. Densely arranged main features 21 are separated by smaller pitches, and the isolated main feature 22 is separated by a greater pitch. Due to the difference in pitch, the densely arranged main features 21 and the isolated main feature 22 have different process windows. In order to make these process windows overlap as much as possible, the isolated main feature 22 is made to behave more like the dense main features 22 by decreasing the pitch that separates them. This can be accomplished through the assistance of a recessed region 12 on the translucent substrate 1.

The recessed region 12 is linear and arranged along the sides of the isolated main feature 22 at a pitch substantially equal to about 0.7 to 1.3 times the pitch of the dense main features 21. This arrangement reduces the pitch between the isolated main feature 22 and its neighboring element (i.e. the linear recessed region 12). With the assistance of the recessed region 12, the performance of the isolated main feature 22 matches the performance of the densely arranged main features 21, thereby increasing the overall process window and depth of focus of the photomask. When illuminated under a process window selected for the densely arranged main features 21, the isolated main feature 22 also show good focus through the assistance of the recessed region 12. If the pitch between the recessed region 12 and the isolated main feature 22 is not between about 0.7 to 1.3 times the pitch between the dense main features 21, the performance of the isolated main feature 22 would not match the performance of the densely arranged main features 21, and consequently the isolated main feature 22 would not show good focus when illuminated under a process window selected for the densely arranged main features 21.

Figure 2:
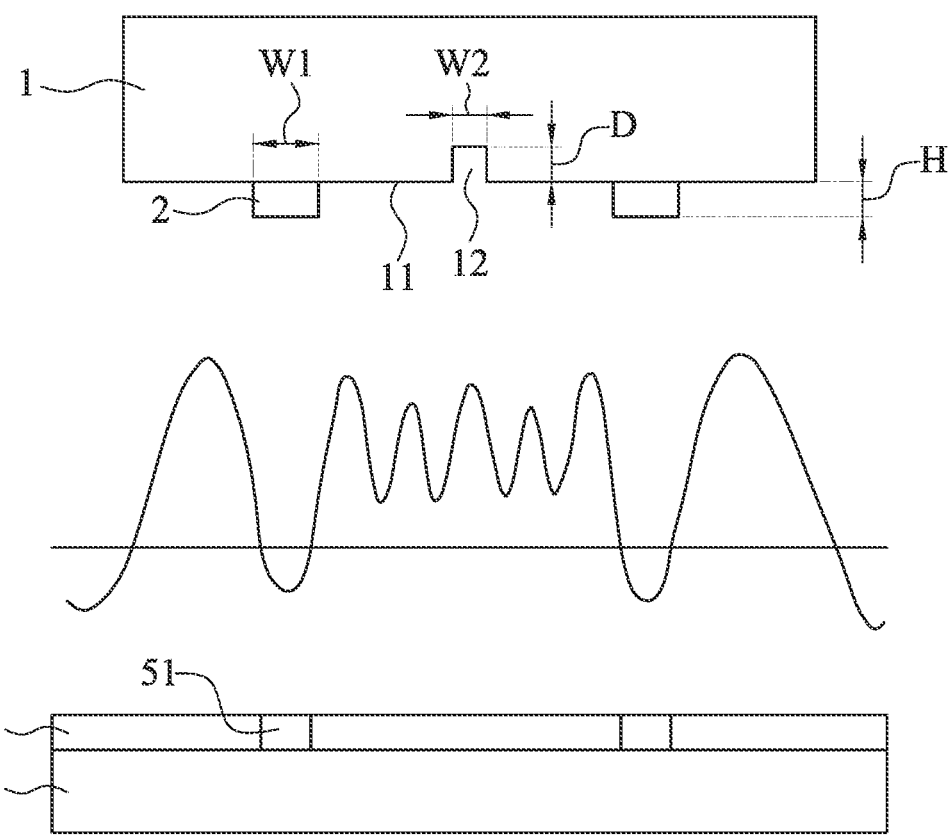
FIG. 2 shows a cross sectional view of a photomask according to some embodiments of the present disclosure.

FIG. 2 shows a cross-sectional view of the photomask in FIG. 1 along a cut line L. The translucent substrate 1 is made of a translucent material, such as quartz or other suitable materials. The main features 2 are made of an opaque material, such as chromium or other suitable materials. The main features 2 protrude from a first surface 11 of the translucent substrate 1, and each have a width W1 and a height H. When illuminated from above, the main features 2 block light incident thereon, and areas of the translucent substrate 1 not covered by the main features 2 allow light to pass through. Thereby, each of the main features 2 is configured to image a pattern 51 onto a material below (e.g. a photoresist layer 5 disposed on a wafer 6) when illuminated from above. Light passing around the edges of the main features 2 are diffracted. In order to increase the sharpness of the pattern 51 imaged onto the photoresist layer 5, the diffraction pattern is adjusted.

The recessed region 12 is formed on the first surface 11 of the translucent substrate 1, and has a width W2 and a depth D. The recessed region 12 is recessed from the first surface 11, and is configured to create a diffraction pattern similar to that of densely arranged main features (e.g. the densely arranged main features 21 of FIG. 1). The radiation energy incident on the photoresist layer 5, after passing through the translucent substrate 1 and diffracted by the protruding main features 2 and the recessed region 12, is shown in FIG. 2. The recessed region 12 increases the sharpness and focus of the pattern 51 imaged onto the photoresist layer 5.

Referring to FIG. 2 again, the specific width W2 and depth D of the recessed region 12 are calculated by algorithms and depend on the specific layout of the photomask. In some embodiments, the width W2 and the depth D are selected such that the recessed region 12 diffracts radiation passing around the recessed region 12 and through the translucent substrate 1. Moreover, the width W2 and the depth D of the recessed region 12 are selected such that no image is patterned by the recessed region 12 onto the photoresist layer 5 below.

Figure 3:
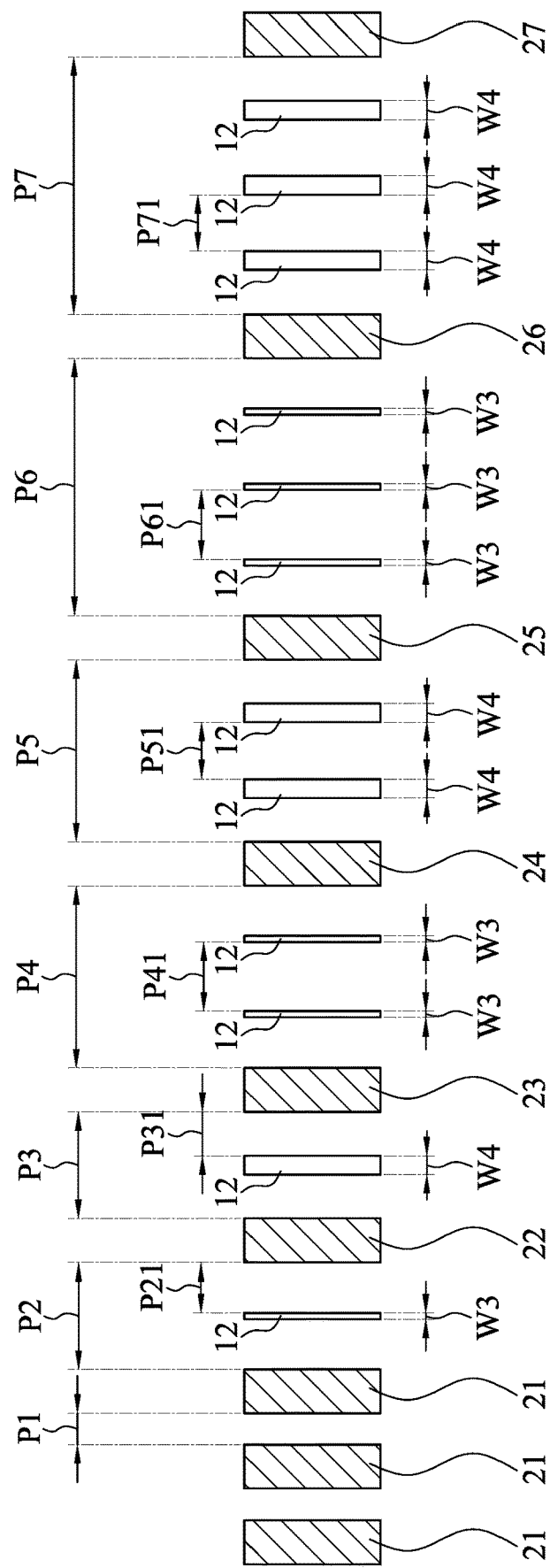
FIG. 3 shows a top view of a photomask according to some embodiments of the present disclosure.

The specific arrangement of the recessed region 12 is also calculated by algorithms and depends on the specific layout of the photomask. Consider main features 2 arranged at different pitches as shown in FIG. 3. Main features 21 are densely arranged main features having a pitch P1 therebetween. The main features 21 and a main feature 22 are separated by a pitch P2. The main feature 22 and a main feature 23 are separated by a pitch P3. The main feature 23 and a main feature 24 are separated by a pitch P4. The main feature 24 and a main feature 25 are separated by a pitch P5. The main feature 25 and a main feature 26 are separated by a pitch P6. The main feature 26 and a main feature 27 are separated by a pitch P7. To achieve similar pitches between elements, recessed regions 12 are arranged between the main features 21 and 22, between the main features 22 and 23, between the main features 23 and 24, between the main features 24 and 25, between the main features 25 and 26, and between the main features 26 and 27. In order to create a pitch P21 similar to the pitch P1 between the main features 21, a recessed region 12 having a width W3 is arranged therebetween. The pitch P3 between the main features 22 and 23 is slightly greater than the pitch P2 between the main features 21 and 22, so a recessed region 12 having a greater width W4 is arranged between the main features 22 and 23 in order to create a pitch P31 similar to the pitch P1. The pitch P4 between the main features 23 and 24 is greater than the pitch P3 between the main features 22 and 23, so two recessed regions 12 having the width W3 are arranged between the main features 23 and 24 in order to create a pitch P41 similar to the pitch P1. The pitch P5 between the main features 24 and 25 is greater than the pitch P4 between the main features 23 and 24, so two recessed regions 12 having the greater width W4 are arranged between the main features 24 and 25 in order to create a pitch P51 similar to the pitch P1. Similarly, the pitch P6 between the main features 25 and 26 is greater than the pitch P5, and the pitch P7 between the main features 26 and 27 is greater than the pitch P6, so three recessed regions 12 having the width W3 are arranged between the main features 25 and 26 to achieve a desired pitch P61 similar to the pitch P1, and three recessed regions 12 having the greater width W4 are arranged between the main features 26 and 27 to achieve a desired pitch P71 similar to the pitch P1.

Referring again to FIG. 2, as dimensions of the elements on the wafer 6 and the main features 2 on the photomask become smaller and smaller, the width W2 of the recessed region 12 also becomes smaller. If the recessed region 12 is a protruding structure, it can also diffract radiation but would be prone to being peeled off or collapsing, especially during the photomask manufacturing process, photomask cleaning, and application of the photomask during photolithography. However, since the recessed region 12 is a recessed portion of the translucent substrate 1 itself, the recessed region 12 does not collapse or peel off from the translucent substrate 1.

In other words, the recessed region 12 functions to change the diffraction pattern of the more isolated main features 2 to match the diffraction pattern of the densely arranged main features 2, and has a structural integrity that prevents it from collapsing or being peeled off. The arrangement and dimensions of the recessed region 12 are selected such that the recessed region 12 diffracts radiation passing through the translucent substrate 1, without imaging a pattern onto the surface below. In some embodiments, the width W2 of the recessed region 12 is less than about ⅕ the width W1 of the main features 2, and the depth D of the recessed region 12 is less than about ⅓ the height H of the main features 2. If the width W2 of the recessed region 12 is greater than about ⅕ the width W1 of the main features 2, or if the depth D of the recessed region 12 is greater than about ⅓ the height H of the main features 2, then the recessed region 12 may image a pattern onto the photoresist layer 5. Additionally, the width W2 along with the location of the recessed region 12 may be selected to adjust the pitch between the recessed region 12 and the isolated main feature 2. In some embodiments, the width W2 of the recessed region 12 is greater than about 1/15 the width W1 of the main features 2, and the depth D of the recessed region 12 is greater than about 1/10 the height of the main features 2. If the width W2 of the recessed region 12 is less than about 1/15 the width W1 of the main features 2, or if the depth D of the recessed region 12 is less than about 1/10 the height H of the main features 2, then the recessed region 12 might be of insufficient size to change the diffraction pattern.

Figure 4:
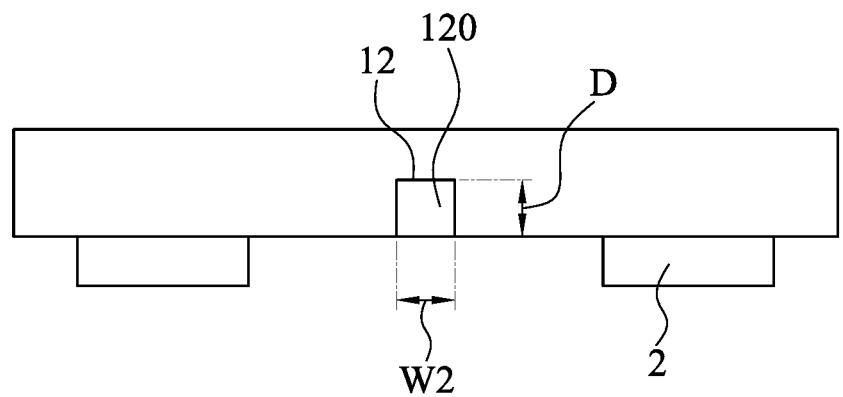
FIG. 4 shows a cross sectional view of a photomask according to some embodiments of the present disclosure.

FIG. 4 shows a cross-sectional view of a photomask according to some embodiments of the present disclosure. The photomask of FIG. 4 is similar to the photomask of FIG. 3, and is different in that an opaque filling 120 is disposed in the recessed region 12. The opaque filling 120 may be the same material of the main features 2, and further assists in blocking radiation. Similarly, the specific width W2 and depth D of the recessed region 12 are calculated by algorithms and depend on the specific layout of the photomask. In some embodiments, the width W2 and the depth D are selected such that the recessed region 12 and the opaque filling 120 disposed therein diffract radiation passing around the recessed region 12 and through the translucent substrate 1. Moreover, the width W2 and the depth D of the recessed region 12 are selected in some embodiments such that no image is patterned by the recessed region 12 and the opaque filling 120 therein onto the photoresist layer 5 below.

Figure 5:
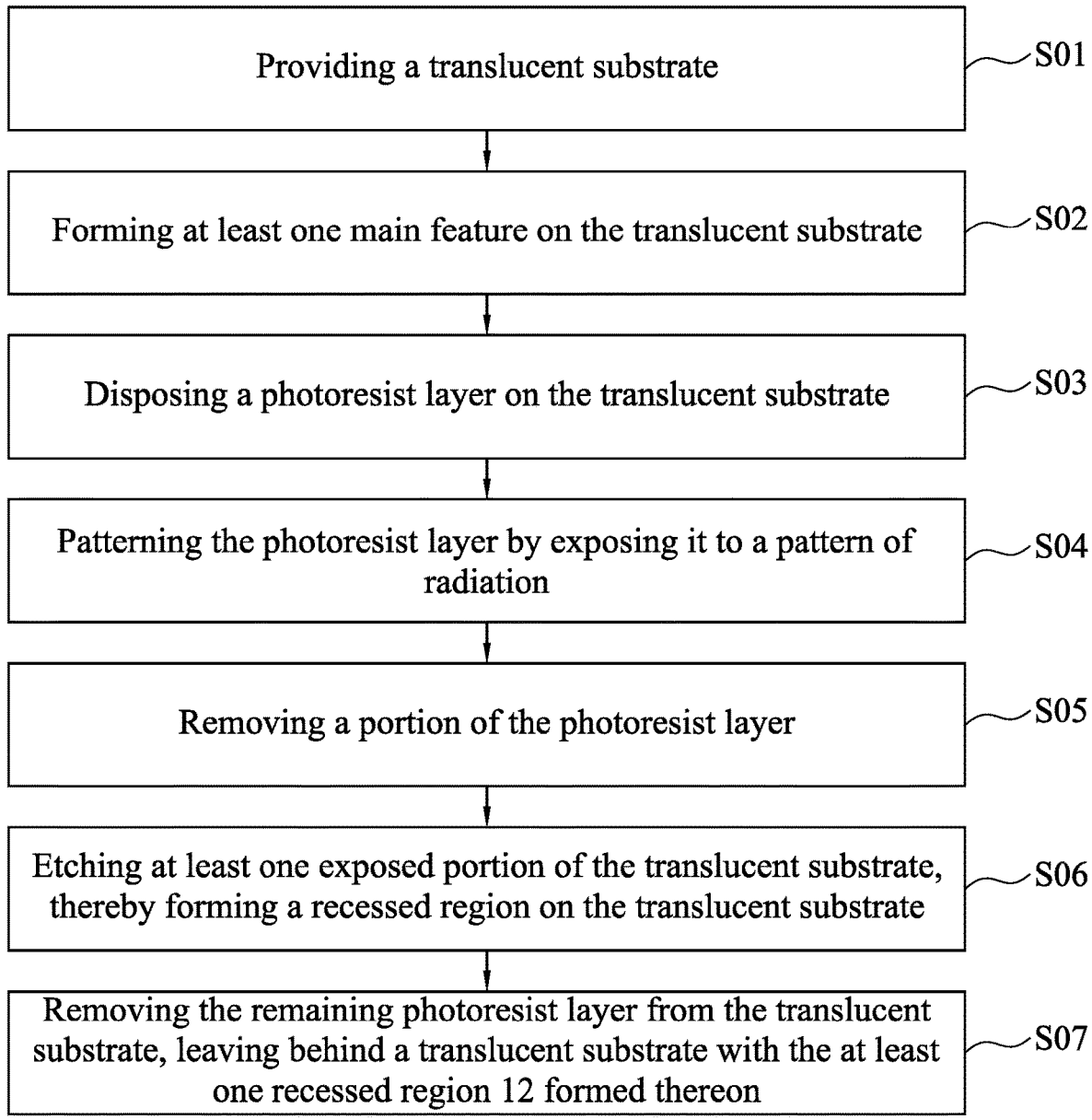
FIG. 5 shows a flowchart for producing a photomask according to some embodiments of the present disclosure.
Figure 6A:
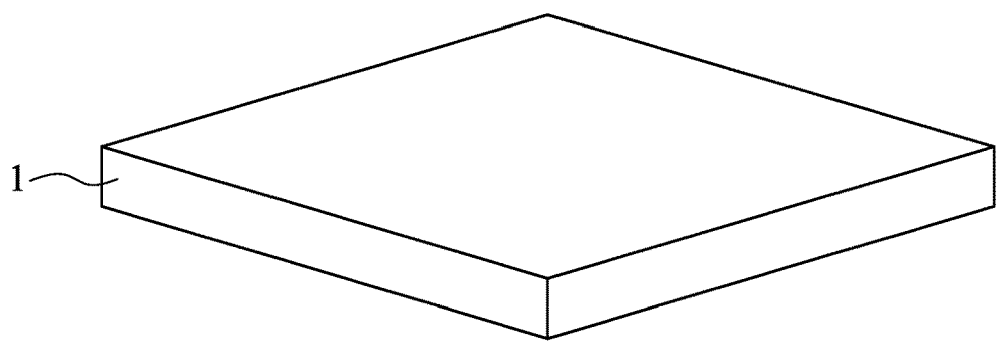
FIG. 6A to 6G show perspective views of a photomask in production according to some embodiments of the present disclosure.

FIG. 5 shows a flowchart of a method for producing a photomask according to some embodiments of the present disclosure. In step S01, a translucent substrate 1 is provided as shown in FIG. 6A. The translucent substrate 1 can be made of a quartz material or the like.

Figure 6B:
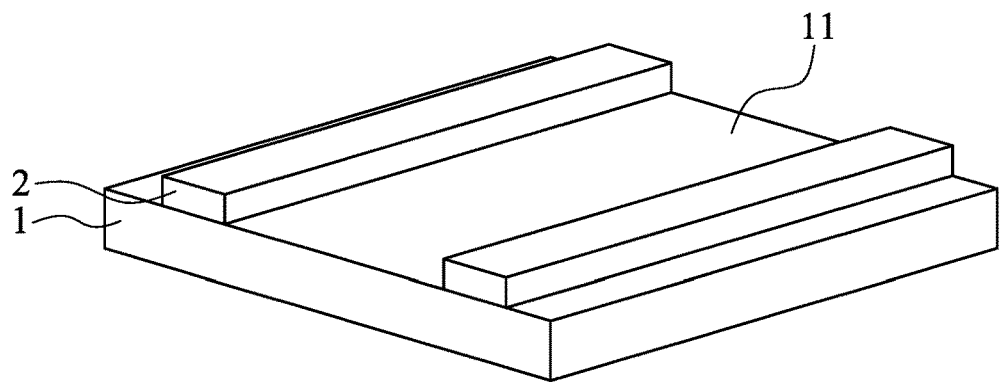

In step S02, main features 2 are formed on the translucent substrate 1 as shown in FIG. 6B. The translucent substrate 1 can be made of a quartz material or the like. Specifically, an opaque layer is disposed on the translucent substrate 1, and a photoresist layer is disposed on the opaque layer. Then, the photoresist layer is patterned by exposing it to a pattern of radiation, and a portion of the photoresist layer is removed according to the exposed pattern. An exposed portion of the opaque layer is then etched, thereby forming the at least one main feature 2 on the translucent substrate 1, and the remaining photoresist layer is removed. The main features 2 are opaque, and can be made of chromium or the like. The main features 2 protrude from a first surface 11 of the translucent substrate 1. The main features 2 block radiation incident thereon, and areas of the translucent substrate 1 not covered by the main features 2 allow radiation to pass through. Thereby, each of the main features 2 is configured to image a pattern onto a surface below when illuminated from above. Due to the effects of diffraction, the main features 2 are adjusted by optical proximity correction features so as to image the desired patterns when illuminated from above.

Figure 6C:
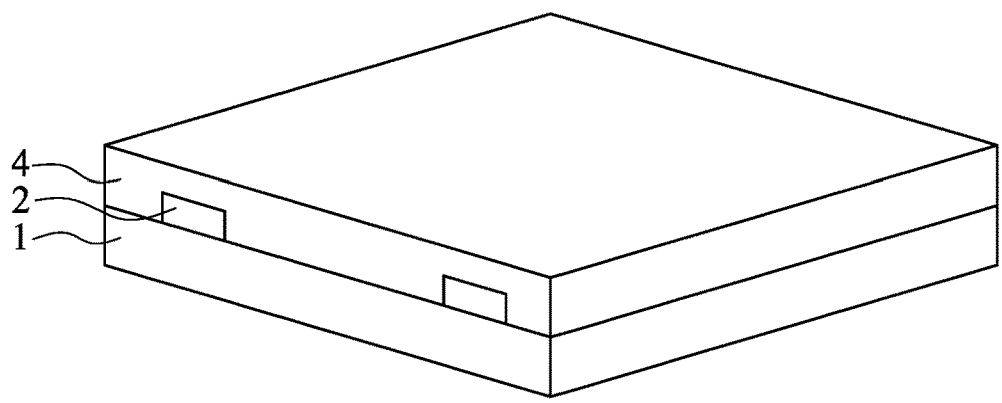

In step S03, a photoresist layer 4 is disposed on the translucent substrate 1 as shown in FIG. 6C. This step can be achieved by applying a liquid solution of photoresist onto the translucent substrate 1, and spinning the translucent substrate 1 to produce a photoresist layer 4.

Figure 6D:
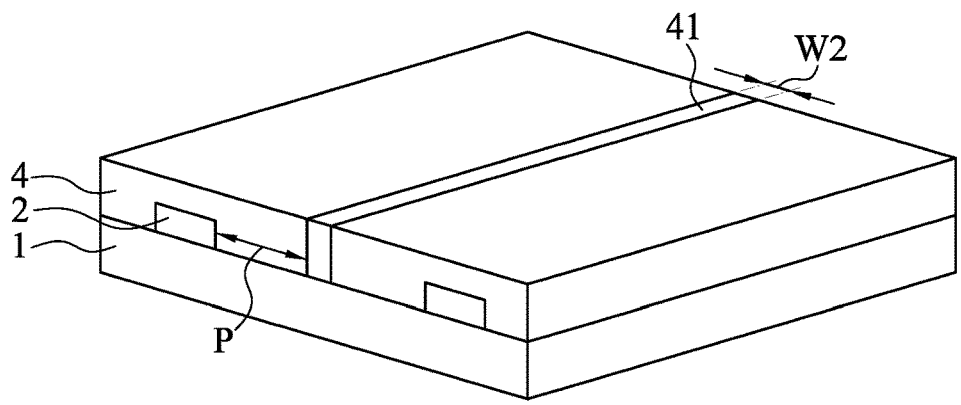

In step S04, the photoresist layer 4 is patterned by a direct-write technique, such as electron beam (e-beam) exposure or laser exposure. Specifically, as shown in FIG. 6D, a pattern 41 on the photoresist layer 4 is configured to create a linear recessed region on the translucent substrate 1 in the next step. The linear pattern 41 has a width W2 corresponding to a width of the recessed region on the translucent substrate 1 configured to diffract radiation without imaging a pattern when exposed to radiation. The linear pattern 41 is arranged at a pitch P away from the isolated main feature 2 created in step S02, wherein the pitch P is similar to a pitch between main features that are densely arranged on the translucent substrate (not shown in the Figures).

Figure 6E:
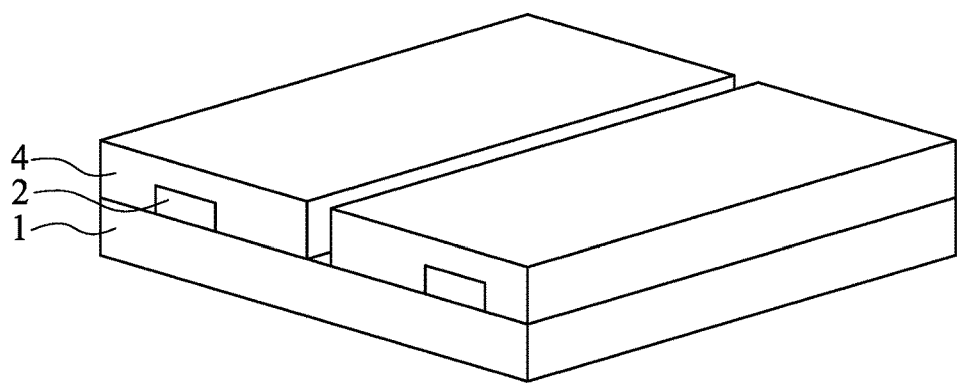

In step S05, a portion of the photoresist layer 4 is removed as show in FIG. 6E. The photoresist layer 4 is partially removed according to the pattern 41 created in step S04, by applying the developer solution. If the photoresist layer 4 is a positive photoresist, then the portion of the photoresist layer 4 exposed to radiation is removed by the developer solution. If the photoresist layer 4 is a negative photoresist, then the portion of the photoresist layer 4 not exposed to radiation is removed by the developer solution. In either case, a remaining photoresist layer 4 is created according to the patterning in step S04. The remaining photoresist layer 4 acts as a protective cover for the next step.

Figure 6F:
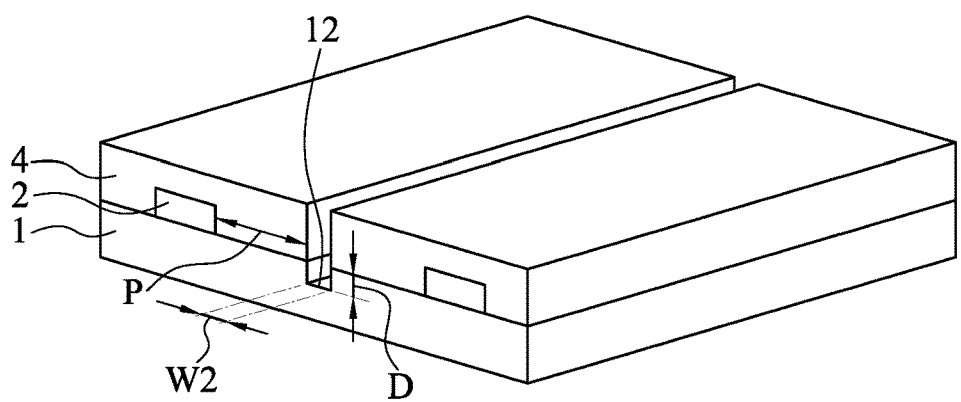

In step S06, at least one exposed portion of the translucent substrate 1 is etched, thereby forming a recessed region 12 on the translucent substrate 1 as shown in FIG. 6F. The regions covered by the remaining photoresist layer 4 are protected and are therefore not etched. In order to reduce undercutting the protective photoresist layer 4 and thereby better control a width W2 of the recessed region 12 being formed, anisotropic etching can be used. The width W2 of the recessed region 12 is similar to or smaller than a depth D of the recessed region 12, and anisotropic etching avoids undercutting the photoresist layer 4. The recessed region 12 is arranged at a pitch P away from the isolated main feature 2, corresponding to the pitch P between the linear pattern 41 created on the photoresist layer 4 and the isolated main feature 2 in step S04. The width W2 of the recessed region 12 corresponds to the width W2 of the linear pattern 41 created on the photoresist layer 4 in step S04, and is configured to diffract radiation without imaging a pattern when exposed to radiation. The recessed region 12 is etched to a depth D, which is also configured to diffract radiation without imaging a pattern when exposed to radiation. In some embodiments, the width W2 of the recessed region 12 is less than about 1/5 the width W1 of the main features 2, and the depth D of the recessed region 12 is less than about 1/3 the height H of the main features 2. If the width W2 of the recessed region 12 greater than about 1/5 the width W1 of the main features 2, or if the depth D of the recessed region 12 is greater than about 1/3 the height H of the main features 2, then the recessed region 12 may image a pattern onto a photoresist layer. Additionally, the width W2 along with the location of the recessed region 12 may be selected to adjust the pitch P between the recessed region 12 and the isolated main feature 2.

Figure 6G:
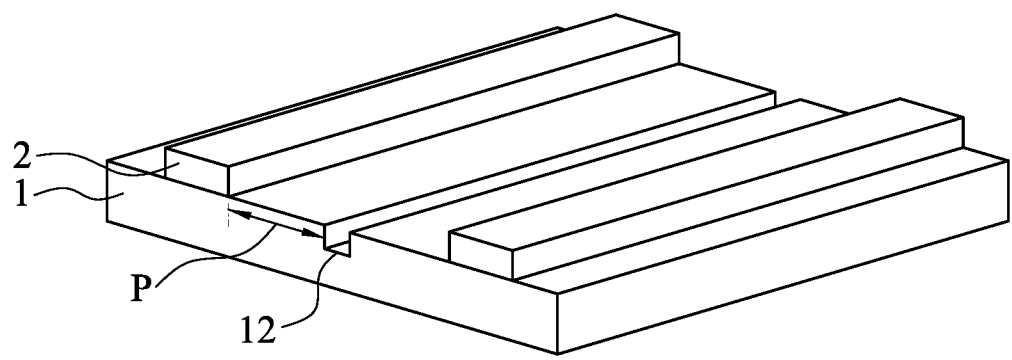

In step S07, the remaining photoresist layer is removed from the translucent substrate 1, leaving behind the translucent substrate 1 with the at least one recessed region 12 formed thereon as shown in FIG. 6G. Referring again to FIG. 6F, as the remaining photoresist layer 4 is removed in some embodiments of the present disclosure, the recessed region 12 is at no danger of being peeled off, because the recessed region 12 is a hollow element, and also because the recessed region 12 is not attached to the photoresist 4 being removed. The recessed region 12 is linear and arranged at a pitch P away from the isolated main feature 2 to make the isolated main feature 2 behave more like the dense main features. Moreover, the recessed region 12 has a depth D and a width W2 configured to diffract radiation without imaging a pattern.

In some embodiments, the step S02 may be taken after step S07. In other words, the main features may be formed on the translucent substrate before or after the recessed region is formed. For example, some embodiments of the present disclosure for producing the photomask include the following steps in order.

Figure 7A:
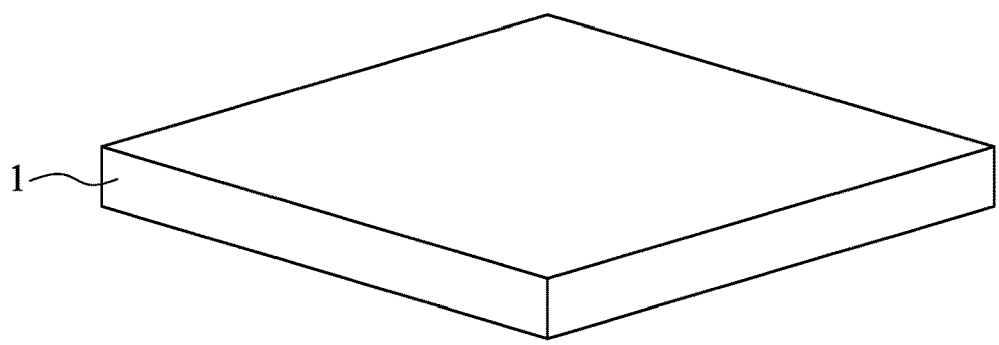
FIG. 7A to 7L show perspective views of a photomask in production according to some embodiments of the present disclosure.
Figure 7B:
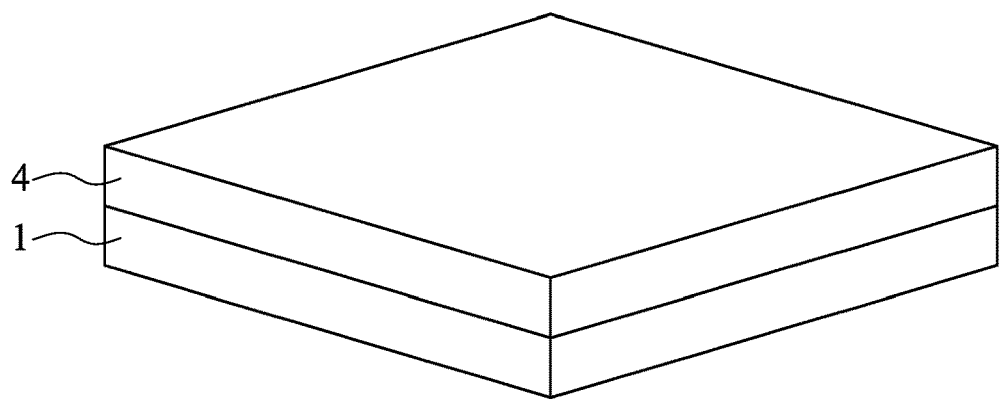
Figure 7C:
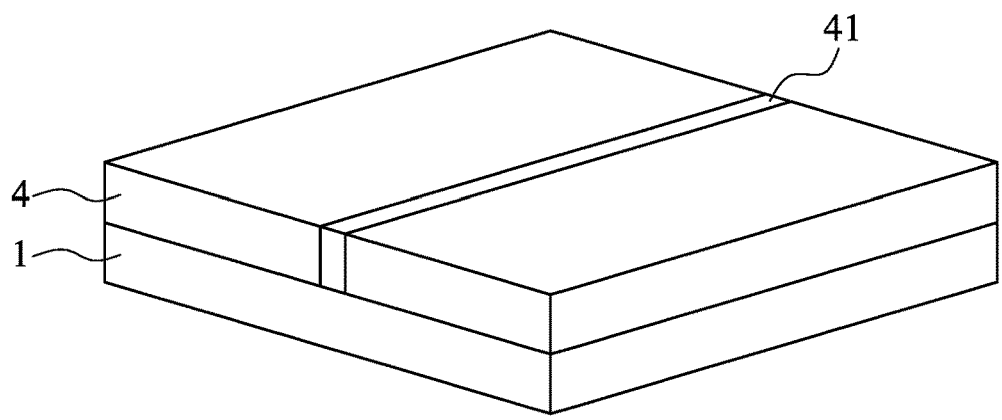
Figure 7D:
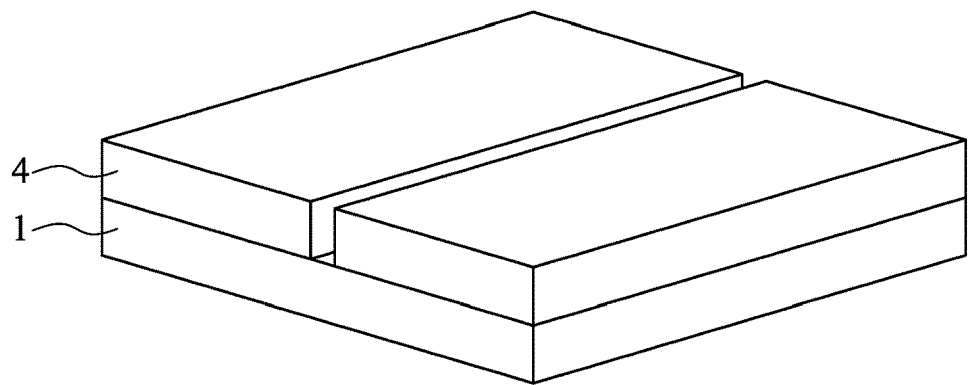
Figure 7E:
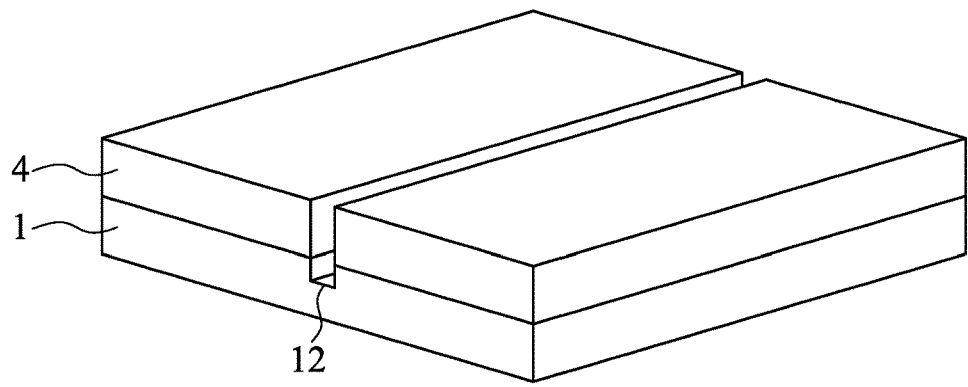
Figure 7F:
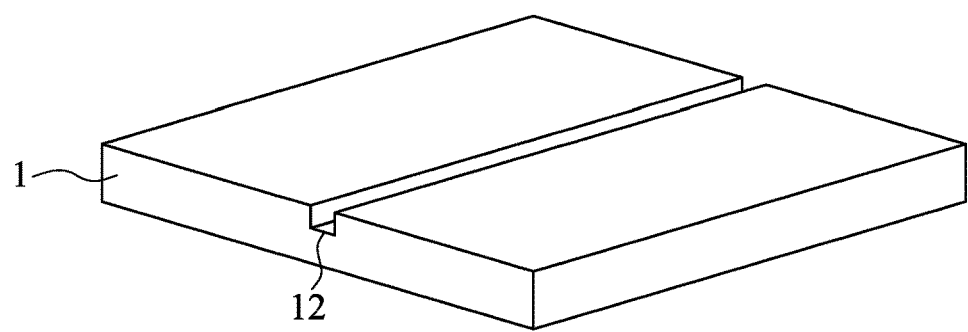

A translucent substrate 1 made of quartz or other suitable materials is provided as shown in FIG. 7A. Next, a photoresist layer 4 is disposed on the translucent substrate 1 as show in FIG. 7B. The photoresist layer 4 is patterned by a direct-write technique, such as electron beam (e-beam) exposure or laser exposure, and a linear pattern 41 is created on the photoresist layer 4 as shown in FIG. 7C. A developer solution is applied to the photoresist layer 4, and portions of the photoresist layer 4 are removed as show in FIG. 7D. The regions of the translucent substrate 1 that are exposed are etched by anisotropic etching to prevent undercutting the remaining photoresist layer 4 as shown in FIG. 7E. The regions of the translucent substrate 1 covered by the remaining photoresist layer 4 are protected from etching. The remaining photoresist layer 4 is then removed, leaving behind a translucent substrate 1 formed with at least one recessed region 12 as shown in FIG. 7F.

At this point in the manufacturing process, if the recessed region 12 is inaccurately formed on the translucent substrate 1, rectifying the inaccuracy is more convenient due to the absence of main features on the translucent substrate 1. For example, if the etching of the recessed region 12 is too shallow, the recessed region 12 may be re-etched without overlaying a photoresist layer on existing main features, thereby decreasing the chance of disturbing main features on the translucent substrate 1. Alternately, if the translucent substrate 1 is to be discarded as defective units, less time and material is wasted since the main features are not formed yet, thereby reducing the cost of discarding defective units.

Figure 7G:
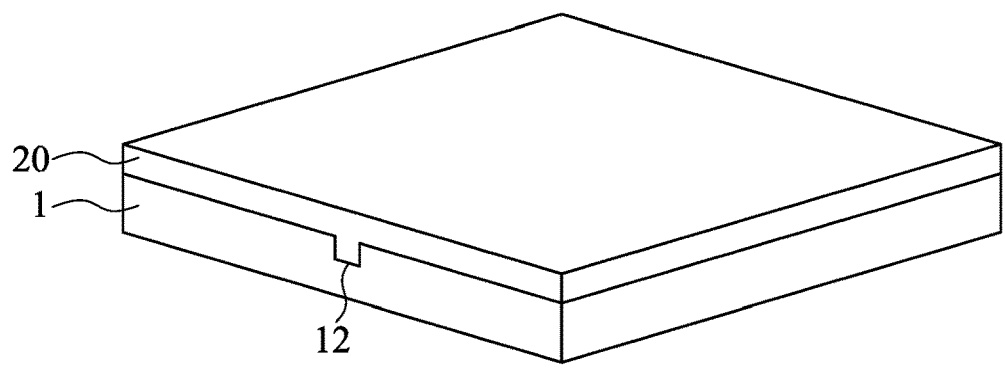
Figure 7H:
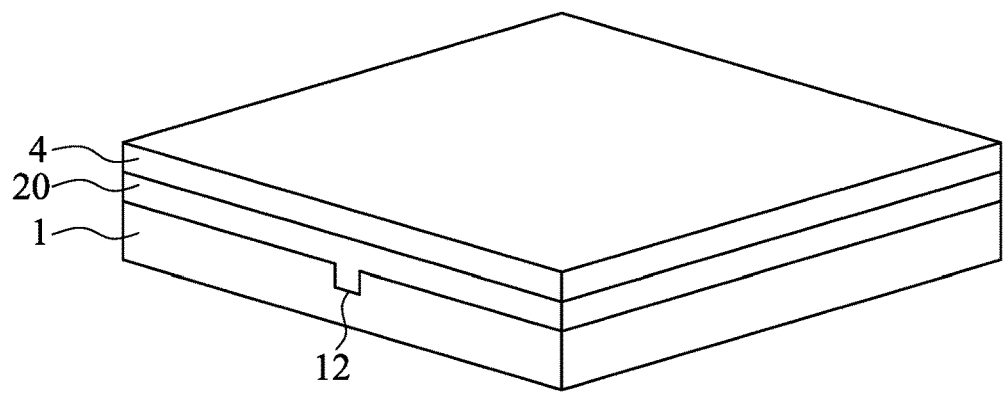
Figure 7I:
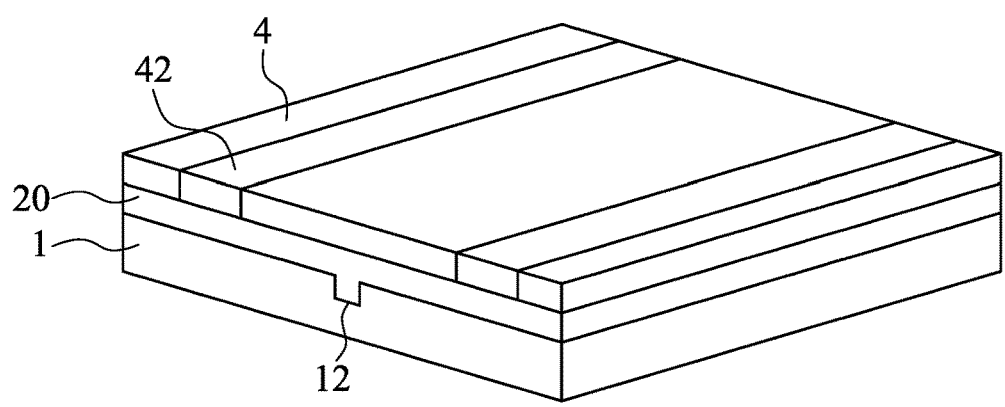
Figure 7J:
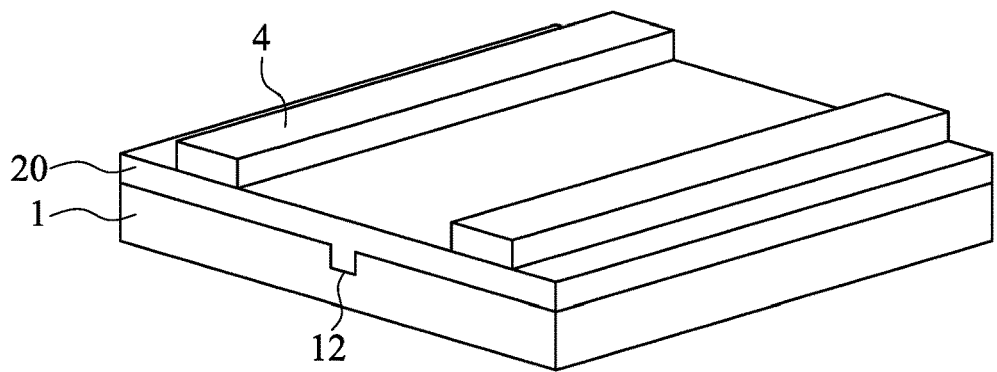
Figure 7K:
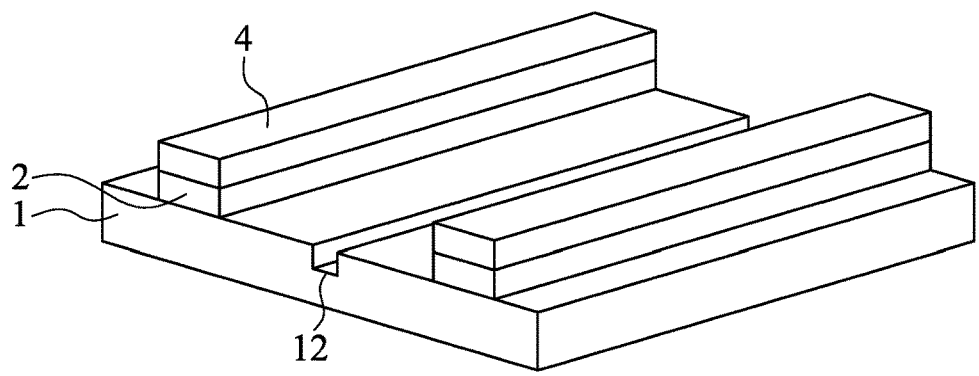
Figure 7L:
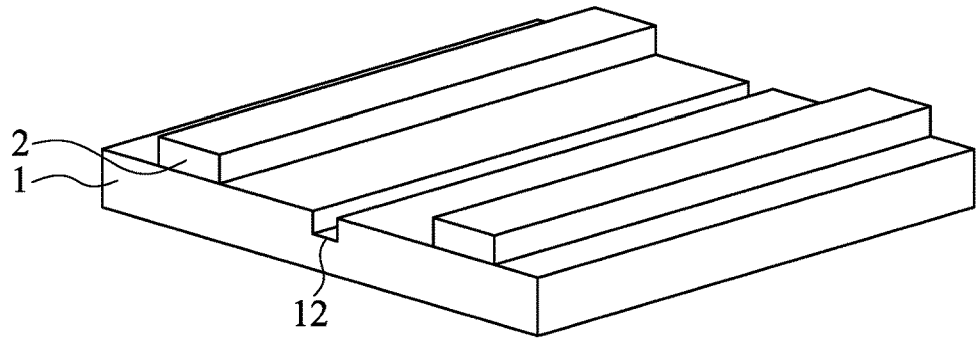

Continuing the manufacturing process after the recessed region 12 is formed, to form main features on the translucent substrate, an opaque film layer 20 is disposed on the translucent substrate 1 as shown in FIG. 7G. Then, a photoresist layer 4 is disposed on the film layer 20 as shown in FIG. 7H. The photoresist layer 4 is patterned by a direct-write technique, such as electron beam (e-beam) exposure or laser exposure as shown in FIG. 7I. Radiation incident on the photoresist layer 4 causes chemical changes in the photoresist, and creates a pattern 42 on the photoresist layer 4. A developer solution is applied to the photoresist layer 4, and portions of the photoresist layer 4 are removed as shown in FIG. 7J. The regions of the film layer 20 that are exposed are etched by anisotropic etching to prevent undercutting the remaining photoresist layer 4 as shown in FIG. 7K. The regions of the film layer 20 covered by the remaining photoresist layer 4 are protected from etching. The remaining photoresist layer 4 is then removed, leaving behind portions of the film layer that form the main features 2 of the photomask as shown in FIG. 7L.

Some embodiments of the present disclosure for producing the photomask is similar to the method described above, but with a difference in that portions of an opaque film layer 20 in a recessed region 12 is patterned to form an opaque filling 120 in the recessed region 12.

Figure 8A:
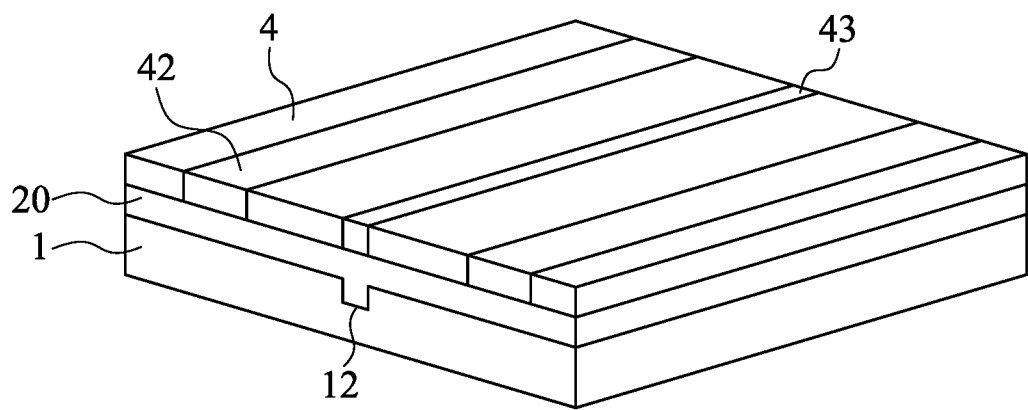
FIG. 8A to 8D show perspective views of a photomask in production according to some embodiments of the present disclosure.

Reference is made to FIG. 8A. Similar to the embodiments described above, a translucent substrate 1 is formed with the recessed region 12, an opaque film layer 20 is disposed on the translucent substrate 1, and then a photoresist layer 4 is disposed on the film layer 20.

Figure 8B:
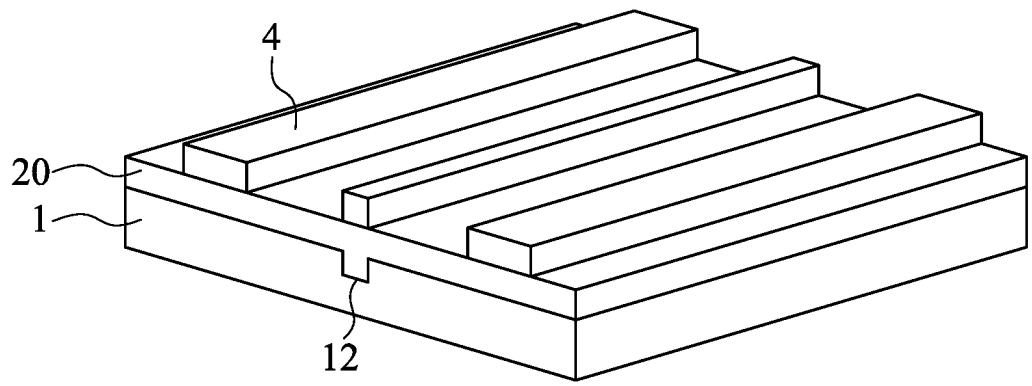
Figure 8C:
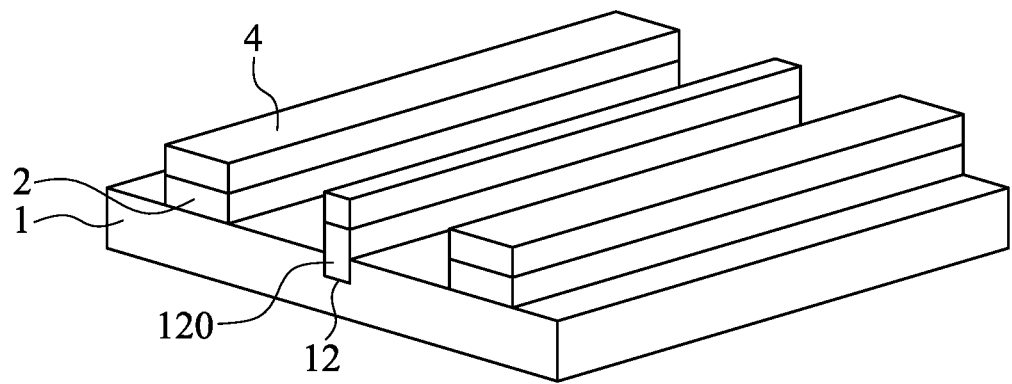
Figure 8D:
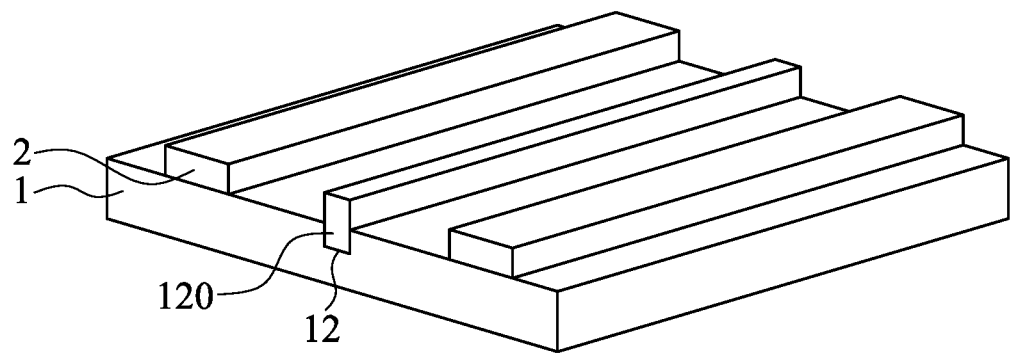

Next, the photoresist layer 4 is patterned to create patterns 42 for main features and a pattern 43 for the opaque filling 120 as shown in FIG. 8A. Radiation incident on the photoresist layer 4 causes chemical changes in the photoresist, and creates the patterns 42 and the pattern 43 on the photoresist layer 4. A developer solution is applied to the photoresist layer 4, and portions of the photoresist layer 4 are removed as shown in FIG. 8B. The regions of the film layer 20 that are exposed are etched by anisotropic etching to prevent undercutting the remaining photoresist layer 4 as shown in FIG. 8C. The regions of the film layer 20 and 120 covered by the remaining photoresist layer 4 are protected from etching. The remaining photoresist layer 4 is then removed, leaving behind portions of the film layer that form the main features 2 and the opaque filling 120 in the recessed region 12 of the photomask as shown in FIG. 8D.

Figure 9:
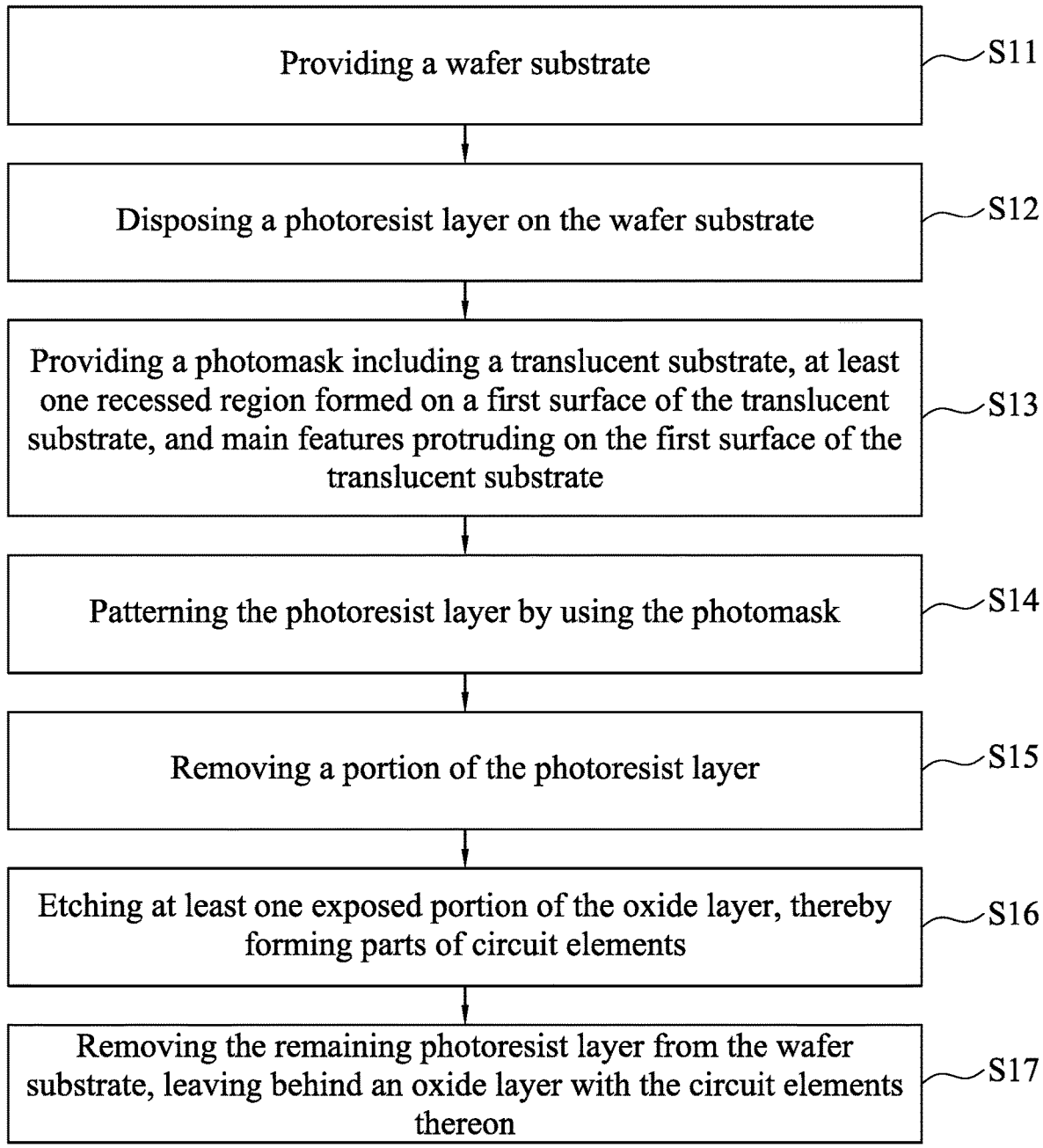
FIG. 9 shows a flowchart for producing an integrated circuit by applying a photomask according to some embodiments of the present disclosure.
Figure 10A:
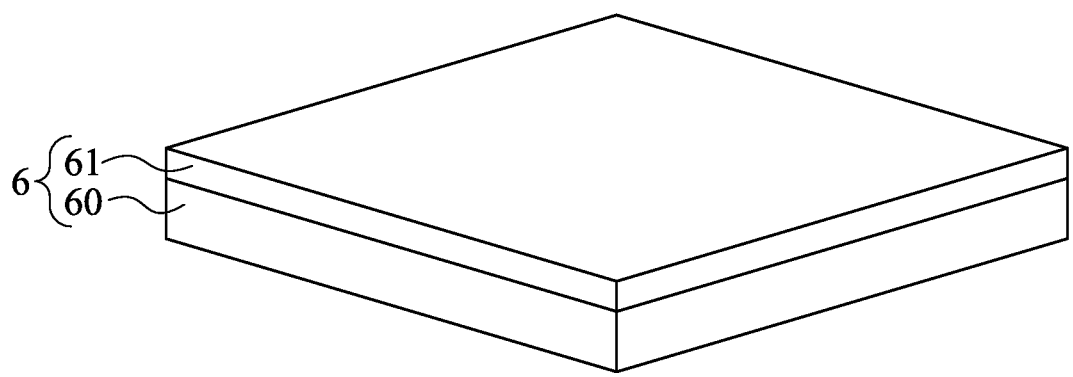
FIG. 10A to 10F show perspective views of an integrated circuit being produced on a wafer substrate by applying a photomask according to some embodiments of the present disclosure.

FIG. 9 shows a flowchart of a method for producing an integrated circuit according to some embodiments of the present disclosure. In Step S11, a wafer 6 is provided as shown in FIG. 10A. The wafer 6 may include a substrate 60 and a layer 61 over the substrate 60.

Figure 10B:
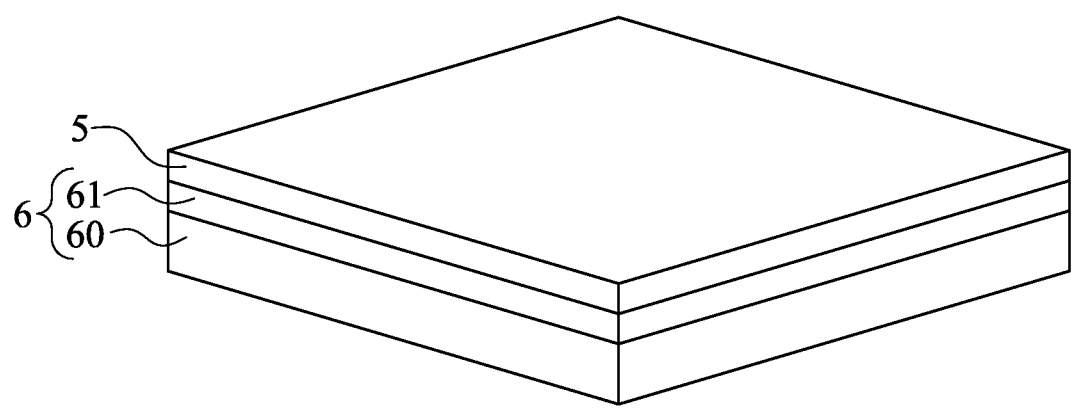

In step S12, a photoresist layer 5 is disposed over the layer 61 as show in FIG. 10B. This step can be achieved by applying a liquid solution of photoresist onto the layer 61, and spinning the wafer 6 to produce a uniformly thick photoresist layer 5.

Figure 10C:
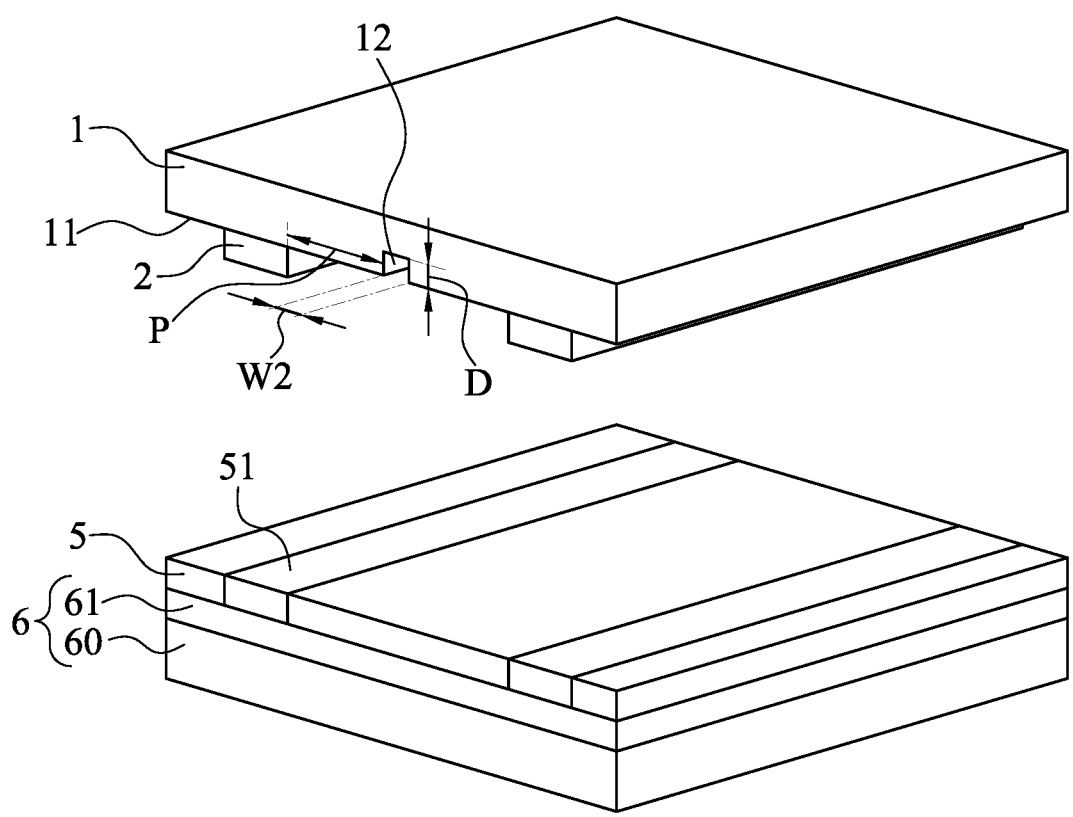

In step S13, a photomask including a translucent substrate 1, at least one recessed region 12 formed on a first surface 11 of the translucent substrate 1, and main 2 features protruding on the first surface 11 of the translucent substrate 1 is provided as shown in FIG. 10C. The translucent substrate 1 can be made of quartz or other suitable materials. The main features 2 are made of an opaque material such as chromium or other suitable materials.

In step S14, the photoresist layer 5 is patterned by using the photomask as shown in FIG. 10C. In this step, the photomask is placed between the photoresist layer 5 and a radiation source. The main features 2 on the photomask, which are opaque, block the radiation incident thereon, while the regions of the translucent substrate 1 not covered by the main features 2 allow radiation to pass through and reach the photoresist layer 5. Radiation passing around the edges of the main features 2 is diffracted.

Some of the main features 2 are densely arranged on the translucent substrate 1, while some of the main features 2 are more isolated. The densely arranged main features 2 are separated by smaller pitches, and the isolated main features 2 are separated by greater pitches. Due to the difference in pitch, the densely arranged main features 2 and the isolated main features 2 have different diffraction patterns and different process windows. In order to make these process windows overlap as much as possible, the isolated main features 2 are made to behave more like the dense main features 2 by decreasing the pitch that separates them. This is accomplished through the assistance of the at least one recessed region 12 on the translucent substrate 1.

The recessed region 12 is linear and arranged along the sides of the isolated main feature 2 at a pitch P closely matching the pitch between main features 2 that are densely arranged on the translucent substrate 1 (not shown in the Figures). This arrangement reduces the pitch between the isolated main feature 2 and its neighboring element (i.e. the linear recessed region). With the assistance of the recessed region 12, the performance of the isolated main feature 2 matches the performance of the densely arranged main features 2, thereby increasing the overall process window and depth of focus of the photomask.

The recessed region 12 is recessed from the first surface 11, and has a width W2 and a depth D configured to create a diffraction pattern similar to that of densely arranged main features 2. The specific width W2 and depth D of the recessed region 12 are calculated by algorithms and depend on the specific layout of the photomask. The width W2 and the depth D are selected such that the recessed region 12 diffracts radiation passing around the recessed region 12 and through the translucent substrate 1. Moreover, the width W2 and the depth D of the recessed region 12 are selected such that no image is patterned by the recessed region 12 onto the photoresist layer 5 in the next step. Typically, the width W2 of the recessed region 12 is less than about ⅕ the width W1 of the main features 2, and the depth D of the recessed region 12 is less than about ⅓ the height H of the main features 2. If the width W2 of the recessed region 12 greater than about ⅕ the width W1 of the main features 2, or if the depth D of the recessed region 12 is greater than about ⅓ the height H of the main features 2, then the recessed region 12 may image a pattern onto the photoresist layer 5. Additionally, the width W2 along with the location of the recessed region 12 may be selected to adjust the pitch P between the recessed region 12 and the isolated main feature 2.

In some embodiment of the present disclosure, an opaque filling may be disposed in the recessed region 12 and further assists in blocking radiation.

The radiation energy incident on the photoresist layer 5, after passing through the translucent substrate 1 and diffracted by the protruding isolated main features 2 and the recessed region 12, is shown in FIG. 2. The recessed region 12 increases the sharpness and focus of the pattern 51 imaged onto the photoresist layer 5.

Exposure to radiation causes a chemical change in the photoresist allowing the photoresist layer 5 to be selectively removed by a developer solution. The selective exposure to radiation patterns the photoresist layer 5 and determines which portions are removed in the next step. The recessed region 12 is not imaged onto the photoresist layer, but assists in increasing the sharpness of the patterns 51 imaged onto the photoresist layer 5 by the main features 2, as shown in FIG. 10C.

Figure 10D:
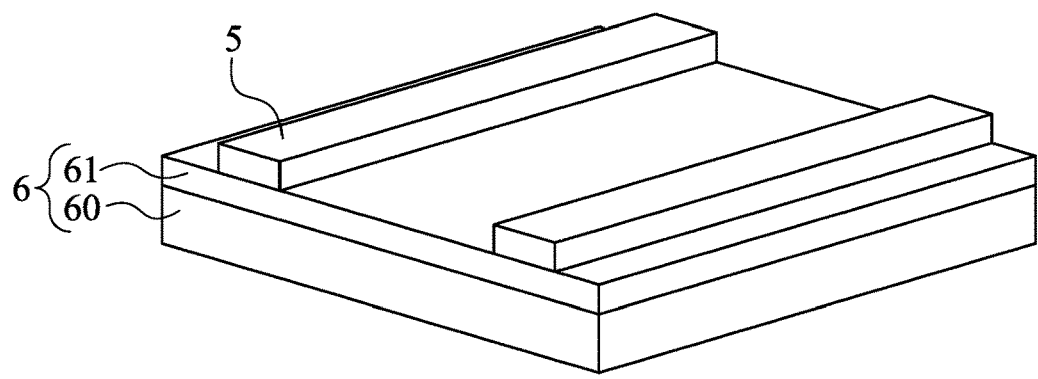

In step S15, a portion of the photoresist layer 5 is removed as shown in FIG. 10D. The photoresist layer 5 is partially removed according to the pattern 51 created in step S14, by applying the developer solution. If the photoresist layer 5 is a positive photoresist, then the portion of the photoresist layer 5 exposed to radiation is removed by the developer solution. If the photoresist layer 5 is a negative photoresist, then the portion of the photoresist layer 5 not exposed to radiation is removed by the developer solution. In either case, a remaining photoresist layer 5 is created according to the patterning in step S14. The remaining photoresist layer 5 acts as a protective cover for the next step.

Figure 10E:
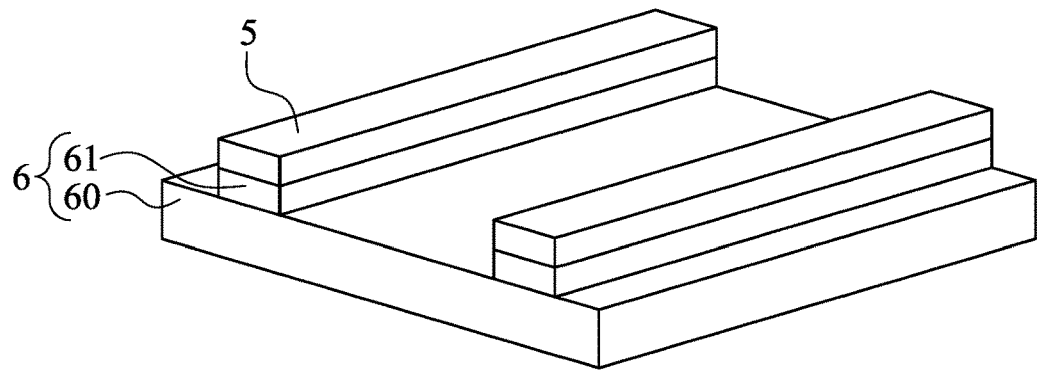

In step S16, at least one exposed portion of the layer 61 is etched, thereby forming parts of the circuit elements as shown in FIG. 10E. The regions covered by the remaining photoresist layer 5 are protected and are therefore not etched.

Figure 10F:
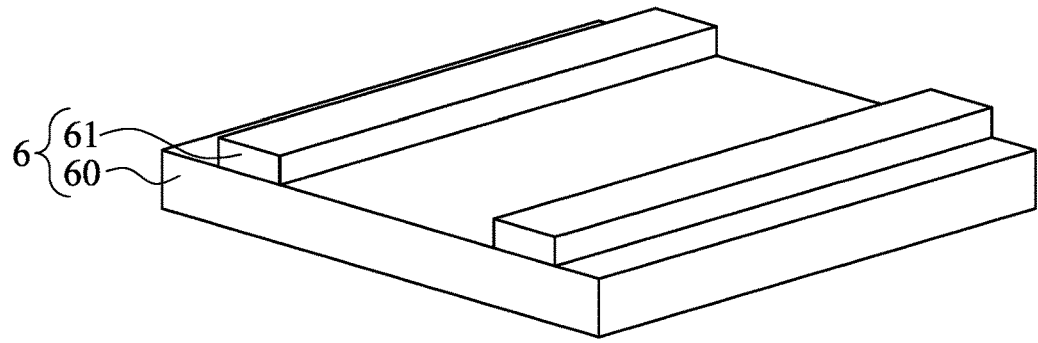

In step S17, the remaining photoresist layer is removed from the wafer 6, leaving behind the patterned layer 61 thereon as shown in FIG. 10F.

According to the present disclosure, a recessed region is formed on a translucent substrate of a photomask. The recessed region does not peel off or collapse during the photomask manufacturing process, photomask cleaning, and application of the photomask during photolithography, and is configured to diffract radiation passing through the translucent substrate such that the depth of field of the photomask is increased.

According to some embodiments of the present disclosure, a photomask includes a translucent substrate having a recessed region recessed from a first surface of the translucent substrate, and at least one main feature disposed on the translucent substrate, and protruding from the first surface of the translucent substrate.

According to some embodiments of the present disclosure, in a method for producing a photomask at least one main feature is formed on a translucent substrate. A photoresist layer is formed on the translucent substrate. The photoresist layer is patterned to form a linear pattern. The linear pattern of the photoresist layer is removed to expose a portion of the translucent substrate. The exposed portion of the translucent substrate is etched to form a recessed region on the translucent substrate. The patterned photoresist layer is removed from the translucent substrate.

According to some embodiments of the present disclosure, in a method for producing an integrated circuit, a photoresist layer is formed on a wafer. A photomask is provided, wherein the photomask has a translucent substrate, a recessed region recessed from a first surface of the translucent substrate and configured to diffract radiation without imaging a pattern, and a main feature protruding from the first surface of the substrate. The photoresist layer is patterned by using the photomask. A portion of the photoresist layer is removed according to the patterning. The exposed portion of the wafer is etched. The patterned photoresist layer is removed from the wafer.

The foregoing outlines main features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photomask comprising:
    a substrate having a recessed region recessed from a first surface of the substrate; and
    at least one main feature disposed on the substrate, and protruding from the first surface of the substrate, wherein a depth of the recessed region is less than about one third of a height of the at least one main feature.

2. The photomask according to claim 1, wherein a lengthwise direction of the recessed region is parallel to a lengthwise direction of the at least one main feature.

3. The photomask according to claim 1, wherein the recessed region is configured to diffract radiation without imaging a pattern.

4. The photomask according to claim 3, wherein a width of the recessed region is less than about one fifth of a width of the at least one main feature.

5. The photomask according to claim 1, wherein the at least one main feature comprises a first main feature, a second main feature, and a third main feature, the recessed region is between the first main feature and the second main feature, a first pitch between the first main feature and the recessed region is substantially the same as a second pitch between the second main feature and the third main feature.

6. The photomask according to claim 1, wherein the substrate comprises a quartz material.

7. The photomask according to claim 1, wherein the at least one main feature comprises chromium.

8. The photomask according to claim 1, further comprising an opaque filling disposed in the recessed region.

9. The photomask according to claim 8, wherein a height of the opaque filling is higher than the depth of the recessed region.

10. A method for producing a photomask, comprising:
forming at least one main feature on a substrate;
forming a photoresist layer on the substrate;
patterning the photoresist layer to expose a portion of the substrate;
determining a depth of a recessed region based on a height of the main feature;
etching the exposed portion of the substrate to form the recessed region with the determined depth in the substrate; and
removing the patterned photoresist layer from the substrate.

11. The method according to claim 10, wherein etching the exposed portion of the substrate comprises anisotropic etching the exposed portion of the substrate.

12. The method according to claim 10, wherein forming the at least one main feature on the substrate is performed before etching the exposed portion of the substrate to form the recessed region on the substrate.

13. The method according to claim 10, wherein forming the at least one main feature on the substrate is performed after etching exposed portions of the substrate to form the recessed region on the substrate.

14. The method according to claim 10, further comprising forming an opaque filling in the recessed region.

15. The method according to claim 10, wherein the recessed region is formed having a width less than about one fifth of a width of the at least one main feature.

16. The method according to claim 10, wherein the depth of the recessed region is formed to be less than about one third of the height of the at least one main feature.

17. A method for producing an integrated circuit, comprising:
forming a photoresist layer on a wafer;
patterning the photoresist layer by using a photomask to expose a portion of the wafer, wherein the photomask comprises:
a substrate;
at least one main feature protruding from a first surface of the substrate; and
at least one opaque filling having a first portion in the substrate and a second portion protruding from the first surface of the substrate;
etching the exposed portion of the wafer; and
removing the patterned photoresist layer from the wafer.

18. The method according to claim 17, wherein the at least one main feature comprises a first main feature, a second main feature, and a third main feature, the recessed region is between the first main feature and the second main feature, a first pitch between the first main feature and the recessed region is substantially the same as a second pitch between the second main feature and the third main feature.

19. The method according to claim 17, wherein a width of the recessed region of the photomask is less than about one fifth of a width of the at least one main feature of the photomask.

20. The method according to claim 17, wherein a depth of the recessed region of the photomask is less than about one third of a height of the at least one main feature of the photomask.

* * * * *